United States Patent
Harada

(10) Patent No.: US 12,520,479 B2
(45) Date of Patent: Jan. 6, 2026

(54) MEMORY DEVICE INCLUDING PILLAR-SHAPED SEMICONDUCTOR ELEMENT AND METHOD FOR MANUFACTURING THE SAME

(71) Applicant: Unisantis Electronics Singapore Pte. Ltd., Singapore (SG)

(72) Inventor: Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 418 days.

(21) Appl. No.: 18/311,701

(22) Filed: May 3, 2023

(65) Prior Publication Data

US 2023/0276612 A1 Aug. 31, 2023

Related U.S. Application Data

(63) Continuation of application No. PCT/JP2020/041461, filed on Nov. 6, 2020.

(51) Int. Cl.
*H10B 12/00* (2023.01)

(52) U.S. Cl.
CPC ............. *H10B 12/20* (2023.02); *H10B 12/01* (2023.02)

(58) Field of Classification Search
CPC ........ H10B 12/20; H10B 12/01; H10B 61/22; H10B 63/10; H10B 63/34; H10D 30/021;
(Continued)

(56) References Cited

U.S. PATENT DOCUMENTS

| 5,382,816 A | 1/1995 | Mitsui |
| 2007/0138524 A1* | 6/2007 | Kim ...................... H10B 12/20 257/296 |

(Continued)

FOREIGN PATENT DOCUMENTS

| JP | 02-188966 | 7/1990 |
| JP | 06-021467 A | 1/1994 |

(Continued)

OTHER PUBLICATIONS

Notification of Transmittal of Copies of Translation of the International Preliminary Report on Patentability in PCT/JP2020/041461, dated May 11, 2023 (5 pages).

(Continued)

*Primary Examiner* — Samuel Park
(74) *Attorney, Agent, or Firm* — Crowell & Moring LLP

(57) ABSTRACT

On P layer bases extending in a band shape in a first direction in plan view, N+ layers also extending in a band shape in the first direction and Si pillars are formed. Subsequently, a gate insulating layer and gate conductor layers are formed so as to surround the Si pillars. Subsequently, contact holes whose bottom portions are in contact with the N+ layers are formed in an insulating layer, and first conductor W layers are formed at the bottom portions of the contact holes. Subsequently, insulating layers each having a hole are formed in the contact holes. Subsequently, a second conductor W layer is formed in a second direction perpendicular to the first direction so as to be connected to the gate conductor layers.

15 Claims, 13 Drawing Sheets

(58) Field of Classification Search
CPC .. H10D 30/60; H10D 84/0126; H10D 84/038; H10D 84/83
See application file for complete search history.

(56) References Cited

U.S. PATENT DOCUMENTS

| | | | |
|---|---|---|---|
| 2010/0142257 A1 | 6/2010 | Masuoka et al. | |
| 2010/0213525 A1* | 8/2010 | Masuoka | H10D 84/038 257/329 |
| 2010/0295135 A1* | 11/2010 | Masuoka | H10D 62/371 257/E21.59 |
| 2012/0307568 A1* | 12/2012 | Banna | H10B 43/27 365/185.28 |
| 2016/0042783 A1* | 2/2016 | Masuoka | H10D 64/512 257/329 |
| 2019/0206861 A1 | 7/2019 | Beigel et al. | |

FOREIGN PATENT DOCUMENTS

| | | |
|---|---|---|
| JP | 10-79482 | 3/1998 |
| WO | WO 2009/096468 A1 | 6/2009 |
| WO | WO 2009/096469 A | 5/2011 |

OTHER PUBLICATIONS

Takato, H., et al. "Impact of Surrounding Gate Transistor (SGT) for Ultra-High-Density LSI's" *IEEE Transactions on Electron Devices*, vol. 38, No. 3, pp. 573-578, Mar. 1991 (6 pages).

Chung, H., et al. "Novel $4F^2$ Dram Cell with Vertical Pillar Transistor(VPT)" *2011 Proceeding of the European Solid-State Device Research Conference*, (2011) (4 pages).

Wong, H.S. Phillip, et al. "Phase Change Memory: A Comprehensive and Thorough Review of PCM Technologies, Including a Discussion of Material and Device Issues, Is Provided in This Paper" *Proceeding of IEEE*, vol. 98, No. 12, Dec. 2010, pp. 2201-2227 (27 pages).

Tsunoda, K., et al. "Low Power and High Speed Switching of Ti-doped NiO ReRAM Under the Unipolar Voltage Source of Less Than 3 V" IEEE (2007) (4 pages).

Kang, W., et al., "Reconfigurable Codesign of STT-MRAM Under Process Variations in Deeply Scaled Technology", *IEEE Transactions on Electron Devices*, vol. 62, No. 6, Jun. 2015 pp. 1-9 [9 pages].

Ertosun, M. Günhan, et al., "Novel Capacitorless Single-Transistor Charge-Trap DRAM (1T CT DRAM) Utilizing Electrons" *IEEE Electron Device Letters*, vol. 31, No. 5, May 2010, pp. 405-407 (3 pages)

Wan, J., et al., "A Compact Capacitor-Less High-Speed DRAM Using Field Effect—Controlled Charge Regeneration," *IEEE Electron Device Letters*, vol. 33, No. 2, pp. 179-181 Feb. 2012 [3 pages].

* cited by examiner

MEMORY DEVICE INCLUDING PILLAR-SHAPED SEMICONDUCTOR ELEMENT AND METHOD FOR MANUFACTURING THE SAME

CROSS REFERENCES TO RELATED APPLICATIONS

The present application is a continuation application of PCT/JP2020/041461, filed Nov. 6, 2020, the entire contents of which are incorporated herein by reference.

BACKGROUND OF THE INVENTION

1. Field of the Invention

The present invention relates to a memory device including a pillar-shaped semiconductor element and a method for manufacturing the memory device.

2. Description of the Related Art

In recent years, three-dimensional-structure transistors have been used for large-scale integration (LSI). Of these, surrounding gate transistors (SGTs), which are pillar-shaped semiconductor elements, have attracted attention as semiconductor elements that provide semiconductor devices with high integration. In addition, there is a need for semiconductor devices including SGTs with higher integration and higher performance.

A typical planar MOS transistor has a channel extending in the horizontal direction along the upper surface of a semiconductor substrate. By contrast, an SGT has a channel extending in a direction perpendicular to the upper surface of a semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, SGTs allow for higher densities of semiconductor devices than planar MOS transistors. Using such SGTs as selection transistors can achieve increases in the degree of integration of devices such as a dynamic random access memory (DRAM) to which a capacitor is connected (see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)), a phase change memory (PCM) to which a variable resistance element is connected (see, for example, H. S. Philip Wong, S. Raoux, S. Kim, Jiale Liang, J. R. Reifenberg, B. Rajendran, M. Asheghi, and K. E. Goodson: "Phase Change Memory," Proceeding of IEEE, Vol. 98, No. 12, December, pp. 2201-2227 (2010)), a resistive random access memory (RRAM) (see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)), and a magneto-resistive random access memory (MRAM) which varies its resistance by varying the direction of magnetic spin using an electric current (see, for example, W. Kang, L. Zhang, J. Klein, Y. Zhang, D. Ravelosona, and W. Zhao: "Reconfigurable Code-sign of STT-MRAM Under Process Variations in Deeply Scaled Technology," IEEE Transaction on Electron Devices, pp. 1-9 (2015)).

FIG. 3 shows a schematic structural view of an N-channel SGT. A Si pillar 100 (silicon semiconductor pillars are hereinafter referred to as "Si pillars") whose conductivity type is P-type or i-type (intrinsic type) has $N^+$ layers 101a and 101b (semiconductor regions containing donor impurities in high concentrations are hereinafter referred to as "$N^+$ layers") formed in upper and lower portions of the Si pillar 100, one of the $N^+$ layers serving as a source, the other serving as a drain. The portion of the Si pillar 100 between the $N^+$ layers 101a and 101b, which serve as the source and the drain, forms a channel region 102. A gate insulating layer 103 is formed so as to surround the channel region 102. A gate conductor layer 104 is formed so as to surround the gate insulating layer 103. In the SGT, the $N^+$ layers 101a and 101b, which serve as the source and the drain, the channel region 102, the gate insulating layer 103, and the gate conductor layer 104 are formed so as to have a pillar shape as a whole. In a DRAM, a capacitor is connected to the $N^+$ layer 101b, and in a PCM, an RRAM, and an MRAM, a variable resistive element 105 is connected to the $N^+$ layer 101b. The area occupied by the SGT corresponds to the area occupied by a single source or drain $N^+$ layer of a planar MOS transistor. Thus, a circuit chip including SGTs can achieve a smaller chip size than a circuit chip including planar MOS transistors.

SUMMARY OF THE INVENTION

To provide a memory device including SGTs with higher performance and higher integration, reduction in parasitic capacitance between electrodes of each SGT has been required.

To solve the above problems, a method for manufacturing a memory device including a pillar-shaped semiconductor device element according to the present invention, the pillar-shaped semiconductor device element including a semiconductor pillar standing perpendicularly on a substrate and including a first impurity region disposed at a bottom portion, a second impurity region disposed at a top portion, and a region between the first impurity region and the second impurity region serving as a channel, one of the first impurity region and the second impurity region serving as a source, the other serving as a drain, a gate insulating layer surrounding the semiconductor pillar disposed between the first impurity region and the second impurity region, and a gate conductor layer surrounding the gate insulating layer, includes:

a step of forming the first impurity region such that the first impurity region extends in a band shape in a first direction in plan view;

a step of forming the semiconductor pillar that at least partially overlaps the first impurity region in plan view;

a step of forming a semiconductor base that includes the semiconductor pillar and the first impurity region and extends in a band shape in the first direction in plan view such that the semiconductor base connects to the bottom portion of the semiconductor pillar;

a step of forming the gate insulating layer and the gate conductor layer such that the semiconductor pillar is surrounded;

a step of forming a first insulating layer at an outer peripheral portion of the gate conductor layer;

a step of forming, in the first insulating layer, a contact hole that overlaps the first impurity region disposed in the semiconductor base in plan view, has a bottom portion in contact with the first impurity region, and extends in a band shape in the first direction;

a step of forming, at the bottom portion of the contact hole, a first conductor layer that is in contact with the first impurity region and extends in a band shape in the first direction;

a step of forming, in the contact hole on the first conductor layer, a second insulating layer that has a hole or is made of a low-dielectric-constant material;

a step of lowering an upper surface of the second insulating layer below an upper end of the gate conductor layer; and a step of forming a second conductor layer that is in contact with the gate conductor layer and extends in a band shape in a second direction perpendicular to the first direction in plan view.

The method may further include:

a step of forming the semiconductor pillar using a first mask material layer as an etching mask;

a step of forming a third insulating layer that surrounds the semiconductor pillar and has an upper surface located at a bottom portion of the first mask material layer or the top portion of the first semiconductor pillar;

a step of forming a second mask material layer that is disposed on the third insulating layer and surrounds the exposed first mask material layer and the top portion of the semiconductor pillar with an equal width in plan view;

a step of forming, on the third insulating layer, a third mask material layer that partially overlaps the second mask material layer and extends in a band shape in the first direction in plan view; and a step of forming the semiconductor base by etching the third insulating layer, the first impurity region, and the semiconductor substrate using the first mask material layer, the second mask material layer, and the third mask material layer as masks, wherein, in plan view, the second mask material layer may partially protrude beyond the third mask material layer on an opposite side of the semiconductor pillar from the first conductor layer in the second direction.

Furthermore, in the first direction in plan view, the second conductor layer may be formed so as to have a width that is smaller than a longest line segment among point-to-point distances between intersections of an outer peripheral line of the gate conductor layer and straight lines extending in the first direction.

Furthermore, in a vertical direction, the first conductor layer may be formed so as to have an upper end that is located below a lower end of the gate conductor layer.

Furthermore, in a vertical direction, the hole may be formed so as to have an upper end that is located below an upper end of the gate conductor layer.

The method may further include a step of forming, in the semiconductor base outside the first impurity region or the semiconductor pillar outside the second impurity region, a third impurity region that has a polarity opposite to that of the first impurity region or the second impurity region.

Furthermore, the semiconductor pillar may be formed such that a length in the first direction is larger than a length in the second direction in plan view.

The method according to the invention may further include:

a step of forming, on the substrate, a first impurity layer on which the first impurity region is based;

a step of forming, on the first impurity layer, a first semiconductor layer on which the first semiconductor pillar is partially based; and a step of forming, on the first semiconductor layer, a second impurity layer on which the first semiconductor pillar is partially based and which forms at least a part of the second impurity region.

The method may further include:

a step of forming, after forming the gate conductor layer, a fourth insulating layer that has an upper surface located above the gate conductor layer and below an upper surface of the second impurity layer and surrounds an outer periphery of the second impurity layer; and a step of forming a third impurity layer that is in contact with the second impurity layer and has the same polarity as that of the second impurity layer or a conductor layer that is in contact with the second impurity layer and made of an alloy or a metal.

To solve the above problems, a memory device including a pillar-shaped semiconductor device element according to the present invention includes:

a semiconductor pillar standing in a direction perpendicular to a substrate;

a first impurity region connecting to a bottom portion of the semiconductor pillar and extending in a band shape in a first direction so as to at least partially overlap the semiconductor pillar in plan view;

a second impurity region disposed at a top portion of the semiconductor pillar;

a gate insulating layer surrounding the semiconductor pillar disposed between the first impurity region and the second impurity region;

a gate conductor layer surrounding the gate insulating layer;

a semiconductor base connecting to the bottom portion of the semiconductor pillar, including the first impurity region, and extending in a band shape in the first direction in plan view;

a first insulating layer at an outer peripheral portion of the gate conductor layer;

a first material layer disposed in the first insulating layer, overlapping the first impurity region disposed in the semiconductor base in plan view, having a bottom portion in contact with the first impurity region, and extending in a band shape in the first direction and also extending in a vertical direction;

a first conductor layer extending in a band shape in the first direction so as to be in contact with the first impurity region at a bottom portion of the first material layer;

a second insulating layer disposed on the first conductor layer, and having a hole whose upper surface is located below an upper end of the gate conductor or made of a low-dielectric-constant material; and a second conductor layer disposed on the second insulating layer, being in contact with the gate conductor layer, and extending in a band shape in a second direction perpendicular to the first direction in plan view.

Furthermore, in plan view, the semiconductor base surrounding the semiconductor pillar partially protrudes on an opposite side of the semiconductor pillar from the first conductor layer in the second direction.

Furthermore, a width of the second conductor layer in the first direction is smaller than a longest line segment among point-to-point distances between intersections of an outer peripheral line of the gate conductor layer and straight lines extending in the first direction.

Furthermore, in a vertical direction, an upper end of the first conductor layer is located below a lower end of the gate conductor layer.

The memory device further includes, outside the first impurity region, a third impurity region having a polarity opposite to that of the first impurity region.

Furthermore, the semiconductor pillar is formed so as to have a section extending in the first direction in plan view.

BRIEF DESCRIPTION OF THE DRAWINGS

FIGS. 1IA, 1IB, and 1IC are respectively a plan view, a sectional structural view, and another sectional structural view that illustrate the method for manufacturing an SGT-including memory semiconductor device according to the first embodiment.

DESCRIPTION OF THE PREFERRED EMBODIMENTS

Hereinafter, a method for manufacturing an SGT-including memory device according to the present invention will be described with reference to the drawings.

First Embodiment

Hereinafter, a method for manufacturing a DRAM circuit according to a first embodiment of the present invention will be described with reference to FIG. 1AA to FIG. 1KC. Among these figures, figures with the suffix A are plan views, figures with the suffix B are sectional structural views taken along line X-X' in the figures with the suffix A, and figures with the suffix C are sectional structural views taken along line Y-Y'.

Figure 1A:
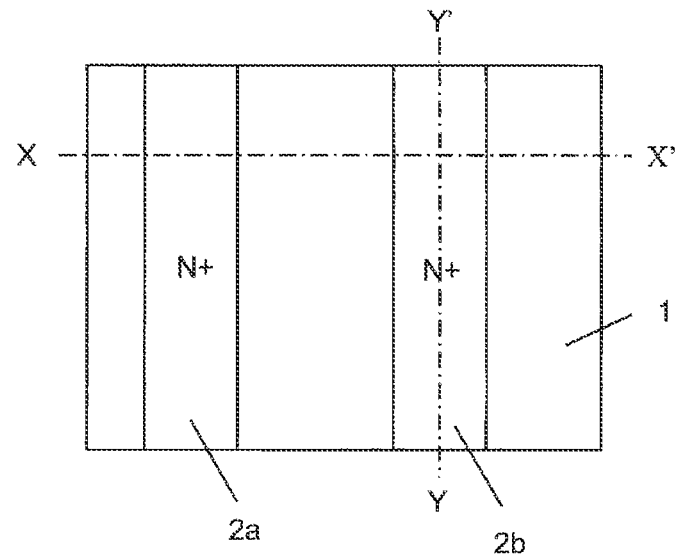
FIGS. 1AA, 1AB, and 1AC are respectively a plan view, a sectional structural view, and another sectional structural view that illustrate a method for manufacturing an SGT-including memory device according to a first embodiment.
Figure 1A:
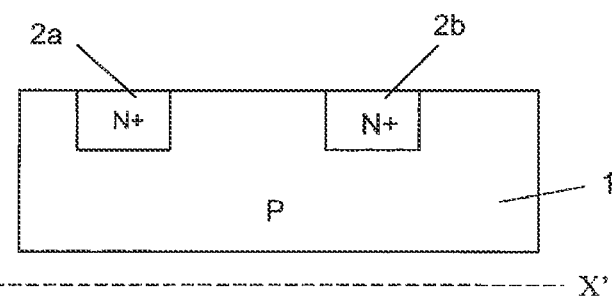
Figure 1A:
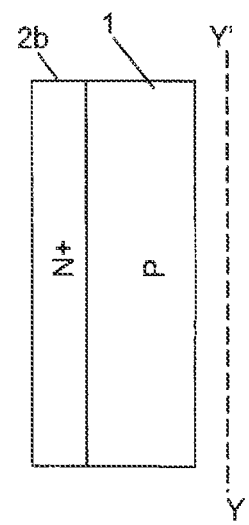

As illustrated in FIGS. 1AA to 1AC, $N^+$ layers 2a and 2b extending in a band shape in a line Y-Y' direction in plan view are formed in an upper portion of a P layer substrate 1 (an example of the "substrate" in the claims).

Figure 1B:
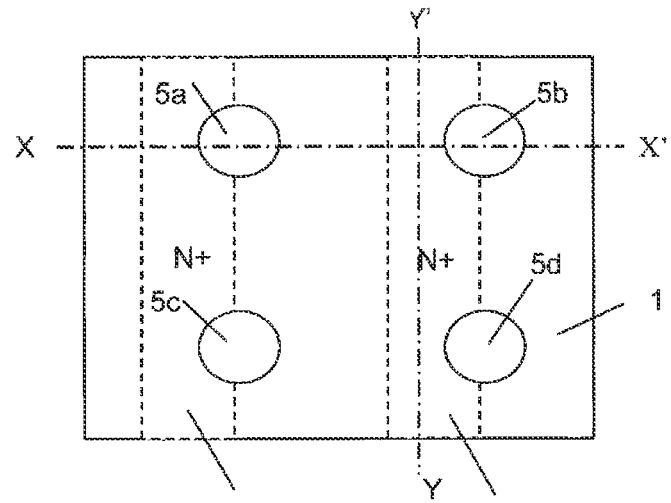
FIGS. 1BA, 1BB, and 1BC are respectively a plan view, a sectional structural view, and another sectional structural view that illustrate the method for manufacturing an SGT-including memory device according to the first embodiment.
Figure 1B:
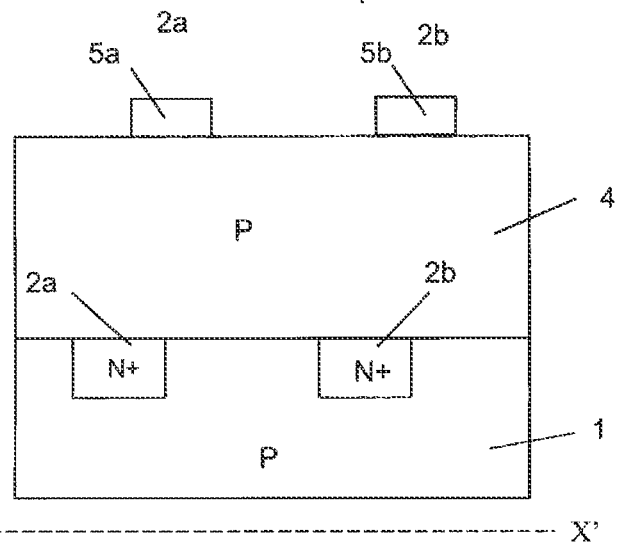
Figure 1B:
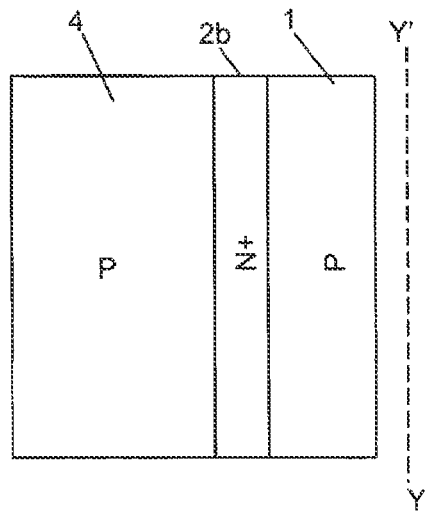

Next, as illustrated in FIGS. 1BA to 1BC, a P layer 4 is formed by epitaxial growth. Subsequently, mask material layers 5a, 5b, 5c, and 5d (examples of the "first mask material layer" in the claims), which are circular in plan view, are formed on the P layer 4 such that the mask material layers 5a and 5c partially overlap the $N^+$ layer 2a and the mask material layers 5b and 5d partially overlap the $N^+$ layer 2b in plan view.

Figure 1C:
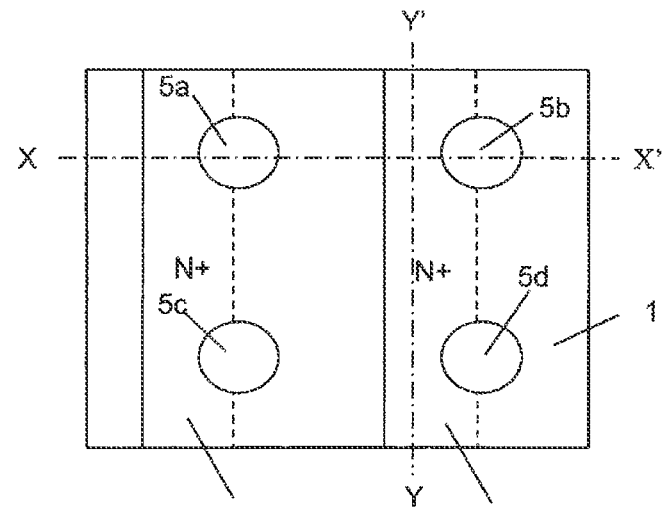
FIGS. 1CA, 1CB, and 1CC are respectively a plan view, a sectional structural view, and another sectional structural view that illustrate the method for manufacturing an SGT-including memory semiconductor device according to the first embodiment.
Figure 1C:
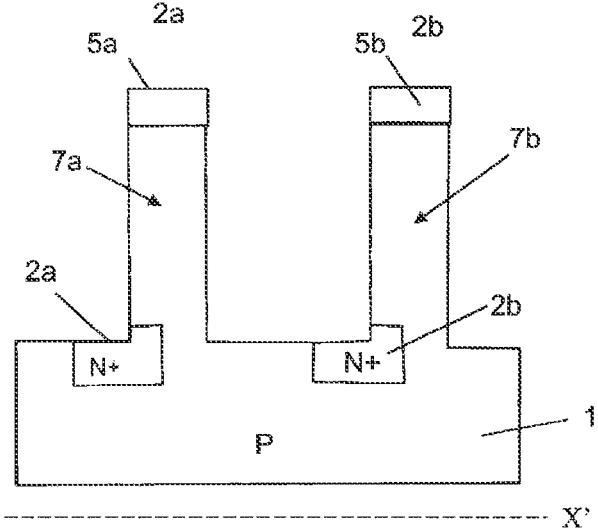
Figure 1C:
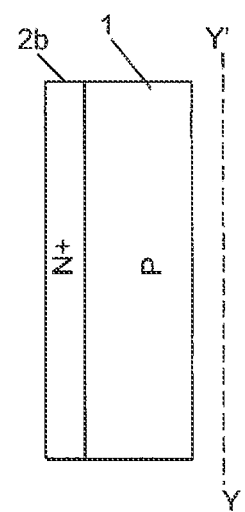

Next, as illustrated in FIGS. 1CA to 1CC, the P layer 4 and upper portions of the P layer substrate 1 and the $N^+$ layers 2a and 2b are etched using the mask material layers 5a to 5d as masks to form Si pillars 7a, 7b, 7c, and 7d (examples of the "semiconductor pillar" in the claims).

Figure 1D:
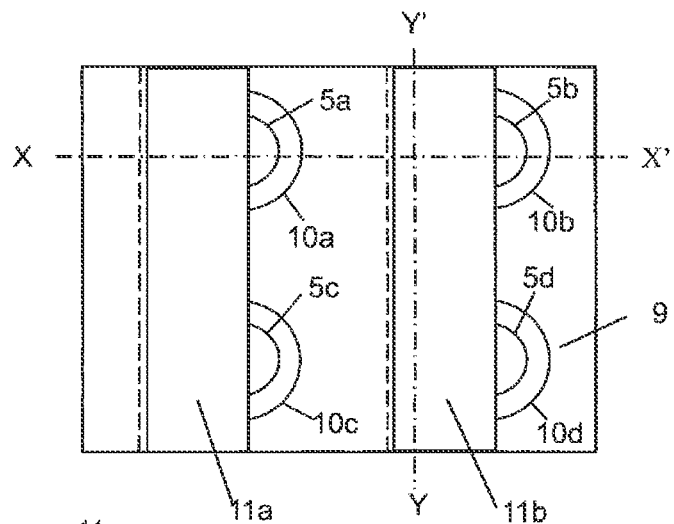
FIGS. 1DA, 1DB, and 1DC are respectively a plan view, a sectional structural view, and another sectional structural view that illustrate the method for manufacturing an SGT-including memory semiconductor device according to the first embodiment.
Figure 1D:
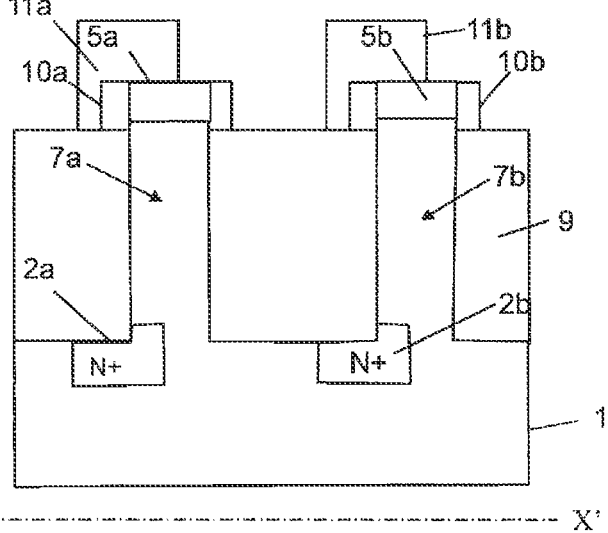
Figure 1D:
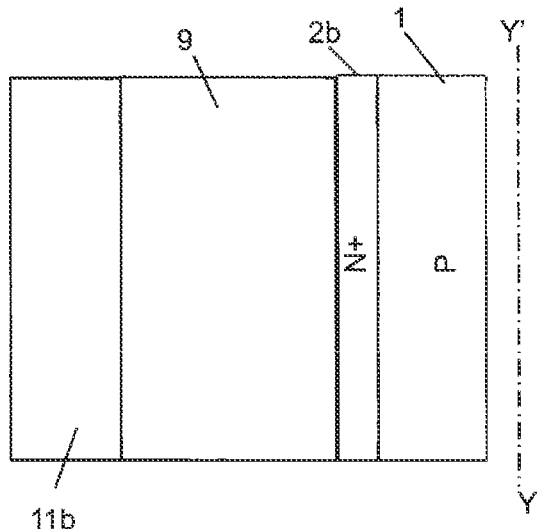

Next, as illustrated in FIGS. 1DA to 1DC, a silicon nitride (SiN) layer 9 (an example of the "third insulating layer" in the claims) is formed so as to surround the Si pillars 7a to 7d such that the upper surface of the SiN layer 9 is located at top portions of the Si pillars 7a to 7d. Subsequently, silicon oxide ($SiO_2$) layers 10a, 10b, 10c, and 10d (examples of the "second mask material layer" in the claims) respectively surrounding the top portions of the Si pillars 7a to 7d and the side surfaces of the mask material layers 5a to 5d with an equal width in plan view are formed. Subsequently, a mask material layer 11a partially overlapping the mask material layers 5a and 5c and the $SiO_2$ layers 10a and 10c and extending in a band shape in the line Y-Y' direction (an example of the "first direction" in the claims) in plan view and a mask material layer 11b partially overlapping the mask material layers 5b and 5d and the $SiO_2$ layers 10b and 10d and extending in a band shape in the line Y-Y' direction are formed. The $SiO_2$ layers 10a to 10d may be formed in such a manner that the mask material layers 5a to 5d are covered with $SiO_2$ layers (not illustrated), and the $SiO_2$ layers are then etched by, for example, reactive ion etching (RIE). Thus, the $SiO_2$ layers 10a to 10d are formed around the mask material layers 5a to 5d, respectively, with an equal width in plan view. Since the mask material layers 5a to 5d are formed in a self-aligned manner with respect to the Si pillars 7a to 7d, respectively, the SiO$_2$ layers 10a to 10d are formed in a self-aligned manner with respect to the Si pillars 7a to 7d, respectively. The SiN layer 9 may be formed after thin SiO$_2$ layers (not illustrated) are formed on the side surfaces of the Si pillars 7a to 7d.

Figure 1E:
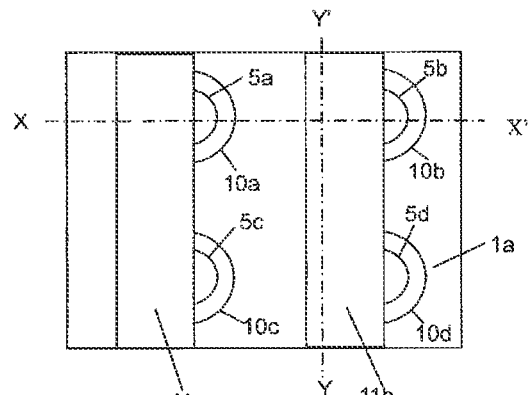
FIGS. 1EA, 1EB, 1EC, and 1ED are respectively a plan view, a sectional structural view, another sectional structural view, and still another sectional structural view that illustrate the method for manufacturing an SGT-including memory semiconductor device according to the first embodiment.
Figure 1E:
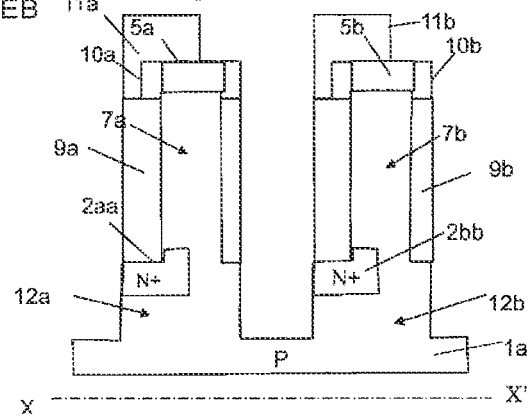
Figure 1E:
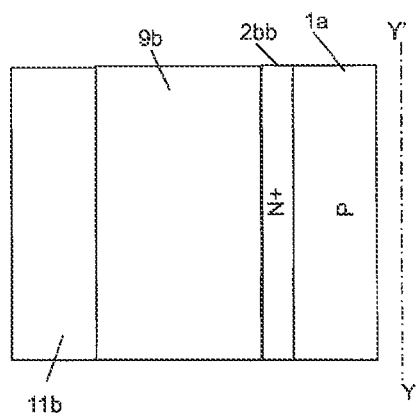
Figure 1E:
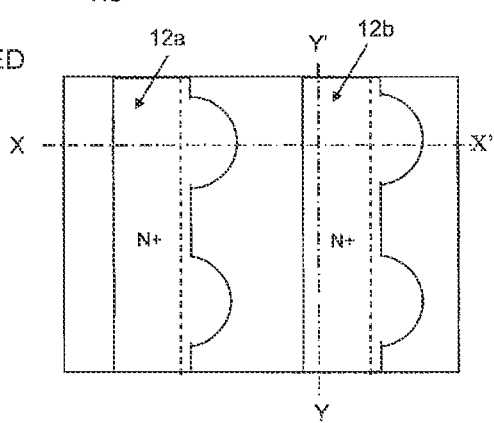

Next, as illustrated in FIGS. 1EA to 1ED, the SiN layer 9, the N$^+$ layers 2a and 2b, and the P layer substrate 1 are etched using the mask material layers 5a to 5d, the mask material layers 11a and 11b (examples of the "third mask material layer" in the claims), and the SiO$_2$ layers 10a to 10d as masks to form P layer bases 12a and 12b (examples of the "semiconductor base" in the claims) constituted by an N$^+$ layer 2aa and the P layer substrate 1a, and an N$^+$ layer 2bb and the P layer substrate 1a, respectively. FIG. 1ED illustrates a plan view of the P layer bases 12a and 12b formed. In plan view, the P layer bases 12a and 12b are shaped such that, as illustrated in FIG. 1ED, the N$^+$ layers 2aa and 2bb extending in a band shape in the line Y-Y' direction and outer peripheries of the Si pillars 7a to 7d partially protrude. Portions of the P layer bases 12a and 12b located where the outer peripheries of the Si pillars 7a to 7d partially protrude are formed using the SiN layers 9a and 9b formed in a self-aligned manner with the Si pillars 7a to 7d as etching masks and thus are formed in a self-aligned manner with the Si pillars 7a to 7d.

Figure 1F:
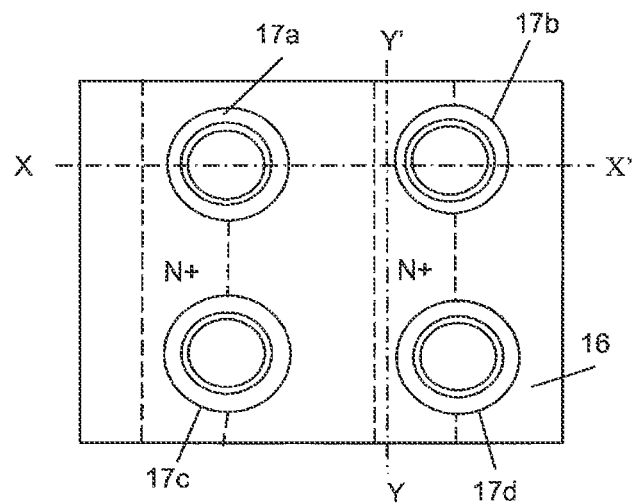
FIGS. 1FA, 1FB, and 1FC are respectively a plan view, a sectional structural view, and another sectional structural view that illustrate the method for manufacturing an SGT-including memory semiconductor device according to the first embodiment.
Figure 1F:
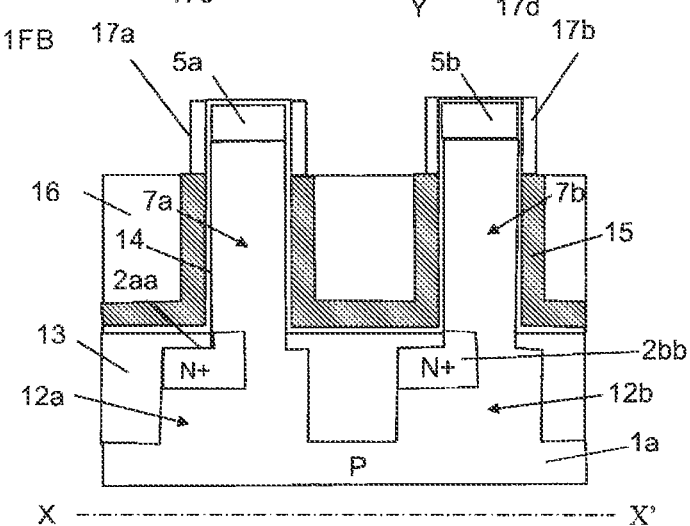
Figure 1F:
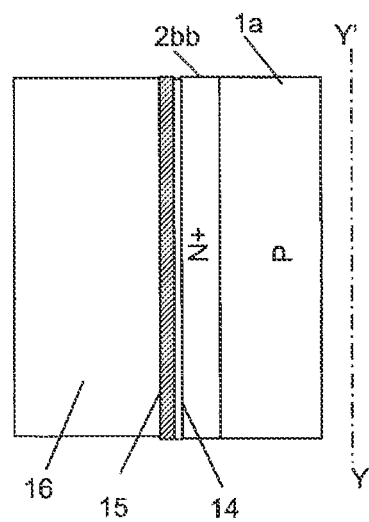

Next, as illustrated in FIGS. 1FA to 1FC, the mask material layers 11a and 11b, the SiO$_2$ layers 10a to 10d, and the SiN layers 9a and 9b are removed. Subsequently, a SiO$_2$ layer 13 is formed so as to surround the P layer bases 12a and 12b such that the upper surface of the SiO$_2$ layer 13 is located above the upper surfaces of the P layer bases 12a and 12b. Subsequently, a hafnium oxide (HfO$_2$) layer 14 (an example of the "gate insulating layer" in the claims) serving as a gate insulating layer is formed so as to surround the Si pillars 7a to 7d by, for example, atomic layer deposition (ALD). Subsequently, a TiN layer (not illustrated) serving as a gate conductor layer and a SiO$_2$ layer (not illustrated) are formed so as to cover the HfO$_2$ layer 14. Subsequently, the TiN layer and the SiO$_2$ layer are polished by chemical mechanical polishing (CMP) such that the upper surfaces thereof are flush with the upper surfaces of the mask material layers 5a to 5d. Subsequently, the SiO$_2$ layer and the TiN layer are etched by RIE such that the upper surfaces thereof are located at upper portions of the Si pillars 7a to 7d, thereby forming a TiN layer 15 and a SiO$_2$ layer 16. Subsequently, a SiN layer (not illustrated) is formed so as to cover the entire surface. Subsequently, the SiN layer is etched by RIE to form SiN layers 17a, 17b, 17c, and 17d respectively surrounding the side surfaces of the mask material layers 5a to 5d and the top portions of the Si pillars 7a to 7d with an equal width in plan view.

Figure 1G:
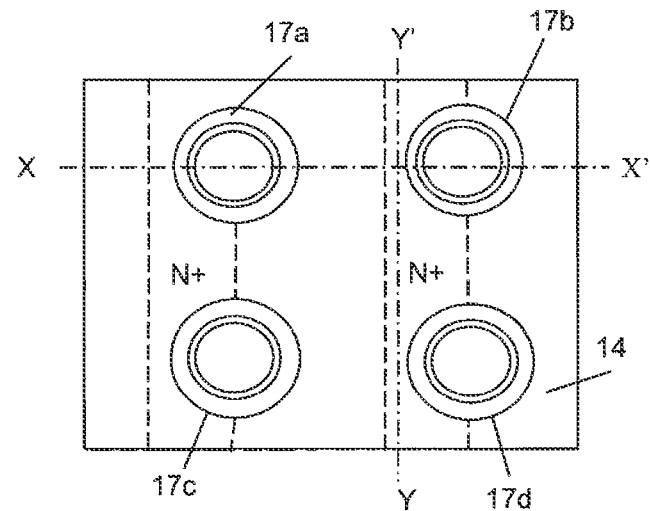
FIGS. 1GA, 1GB, and 1GC are respectively a plan view, a sectional structural view, and another sectional structural view that illustrate the method for manufacturing an SGT-including memory semiconductor device according to the first embodiment.
Figure 1G:
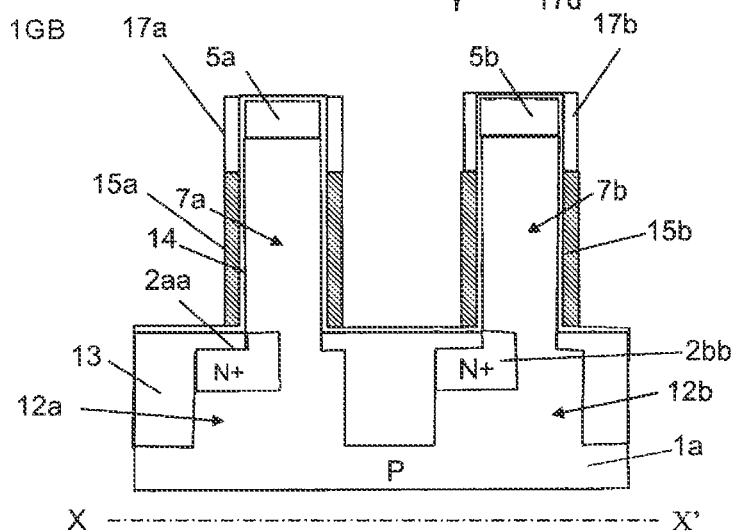
Figure 1G:
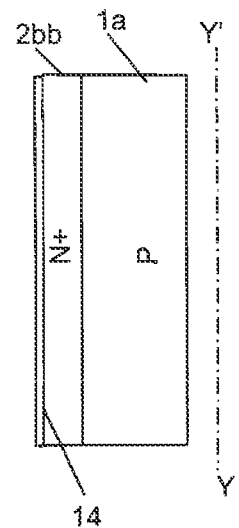

Next, as illustrated in FIGS. 1GA to 1GC, the SiO$_2$ layer 16 is removed. Subsequently, the TiN layer 15 is etched by RIE using the SiN layers 17a to 17d as masks to form TiN layers 15a, 15b, 15c, and 15d (examples of the "gate conductor layer" in the claims) serving as gate conductor layers. In this case, since the SiN layers 17a to 17d serving as etching masks are formed in a self-aligned manner with respect to the Si pillars 7a to 7d, respectively, the TiN layers 15a to 15d are also formed in a self-aligned manner with respect to the Si pillars 7a to 7d, respectively.

Figure 1H:
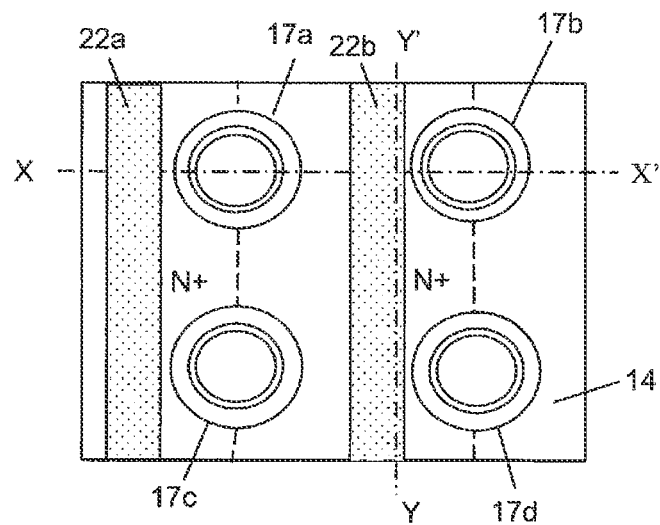
FIGS. 1HA, 1HB, and 1HC are respectively a plan view, a sectional structural view, and another sectional structural view that illustrate the method for manufacturing an SGT-including memory semiconductor device according to the first embodiment.
Figure 1H:
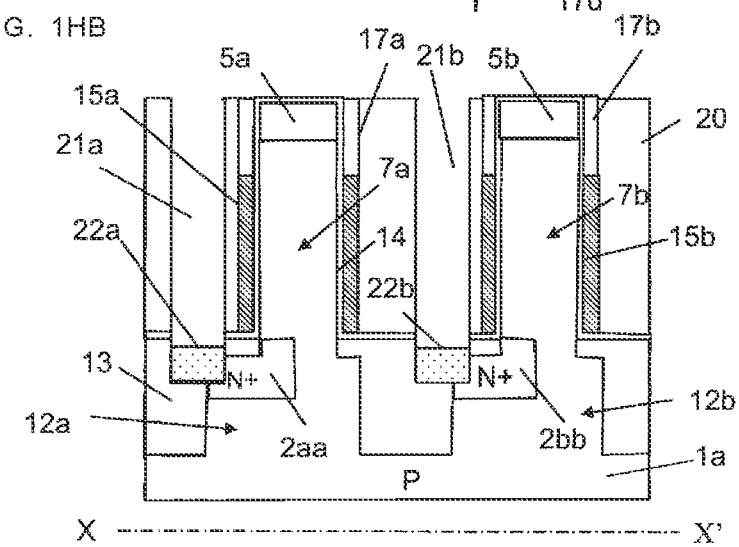
Figure 1H:
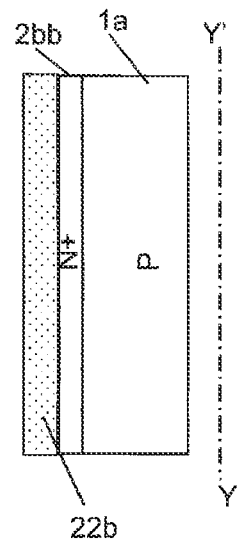
Figure 11A:
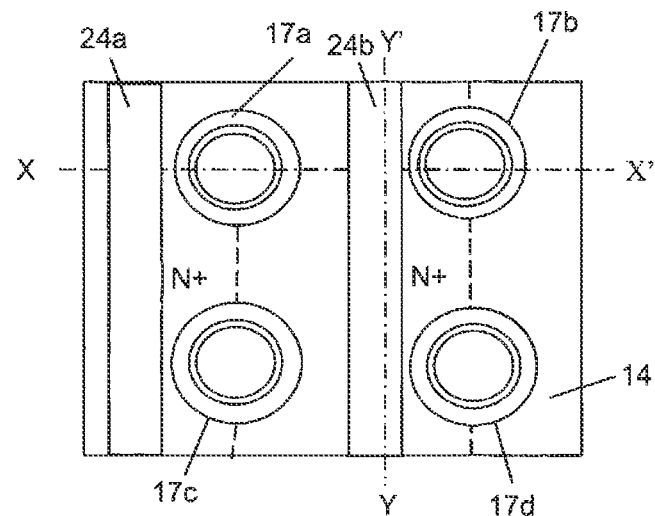
Figure 11B:
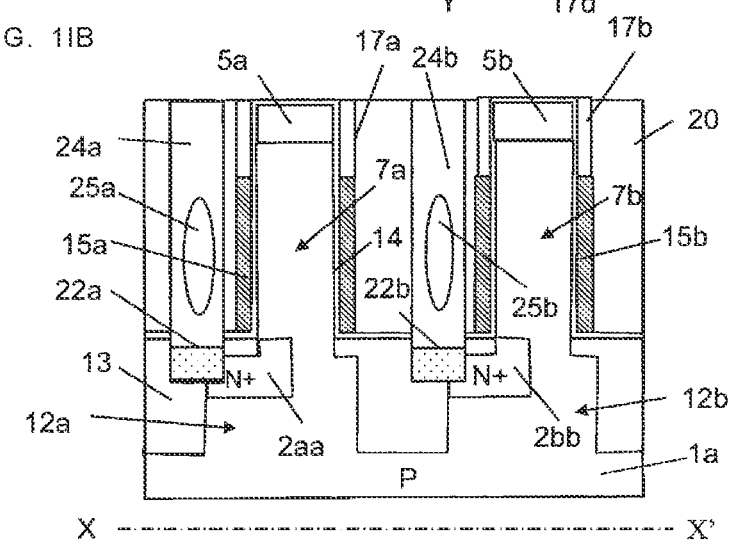
Figure 11C:
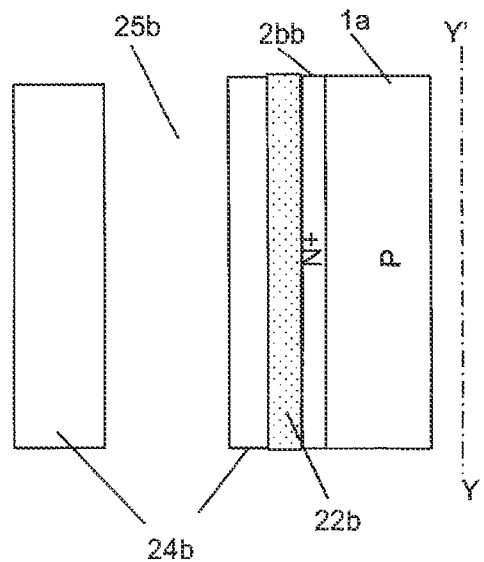

Next, as illustrated in FIGS. 1HA to 1HC, a SiO$_2$ layer (not illustrated) is formed so as to cover the entire surface and polished by CMP such that the upper surface thereof is flush with the upper surfaces of the mask material layers 5a to 5d, thereby forming a SiO$_2$ layer 20. Subsequently, contact holes 21a and 21b (examples of the "contact hole" in the claims) partially overlapping the N$^+$ layers 2aa and 2bb, respectively, extending in a band shape in the line Y-Y' direction in plan view, and having bottom portions disposed at the N$^+$ layers 2aa and 2bb, respectively, are formed. Subsequently, a tungsten (W) layer (not illustrated) is deposited over the entire surface and then polished by CMP such that the upper surface thereof is flush with the upper surfaces of the mask material layers 5a to 5d. Subsequently, the W layer in the contact holes 21a and 21b is etched by RIE to form W layers 22a and 22b (examples of the "first conductor layer" in the claims) respectively in contact with the N$^+$ layers 2aa and 2bb at bottom portions of the contact holes 21a and 21b. The upper surfaces of the W layers 22a and 22b are located below the lower ends of the TiN layers 15a to 15d. Before the W layers 22a and 22b are formed, a buffer metal layer such as a TaN layer for reducing the contact resistance between the W layer 22a and the N$^+$ layer 2aa and between the W layer 22b and the N$^+$ layer 2bb may be formed.

Next, as illustrated in FIGS. 1IA to 1AC, SiO$_2$ layers 24a and 24b (examples of the "second insulating layer" in the claims) respectively having holes 25a and 25b therein are formed in the contact holes 21a and 21b, respectively. The upper ends of the holes 25a and 25b are located below the upper ends of the TiN layers 15a to 15d. The SiO$_2$ layers 24a and 24b may be formed of a low-dielectric-constant material such as silicon oxycarbide (SiOC). In this case, the holes 25a and 25b may be, but need not be, formed.

Figure 1J:
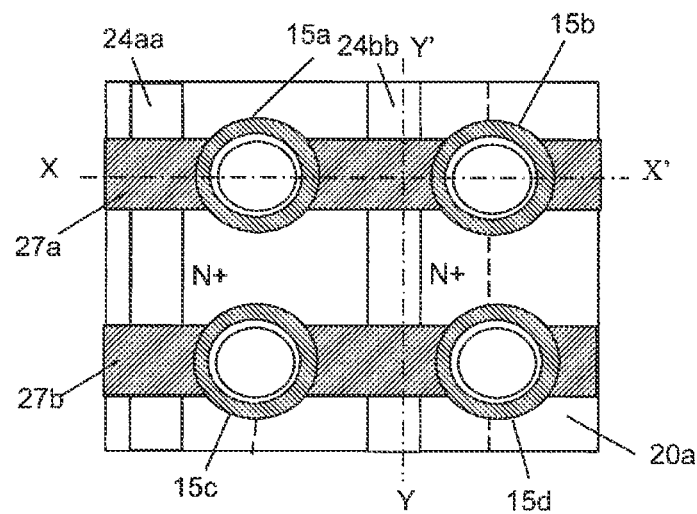
FIGS. 1JA, 1JB, and 1JC are respectively a plan view, a sectional structural view, and another sectional structural view that illustrate the method for manufacturing an SGT-including memory semiconductor device according to the first embodiment.
Figure 1J:
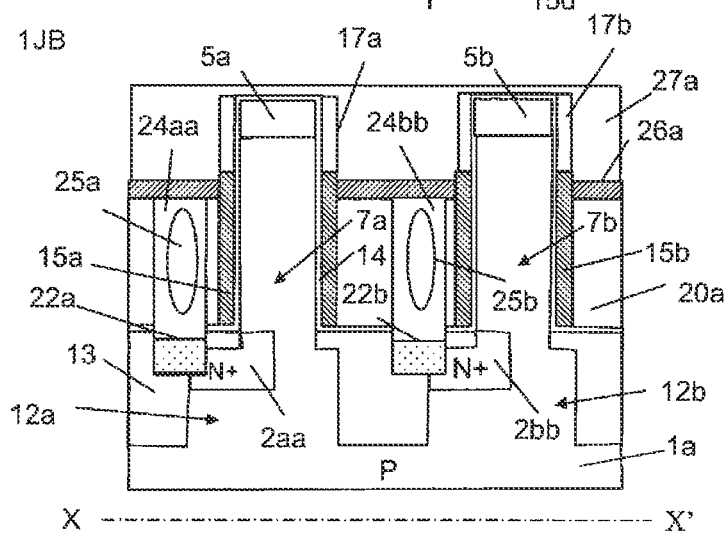
Figure 1J:
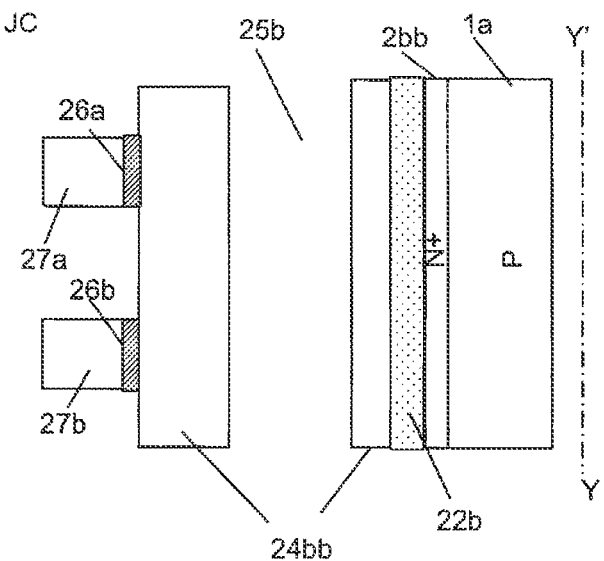

Next, as illustrated in FIGS. 1JA to 1JC, the SiO$_2$ layers 20, 24a, and 24b are etched by RIE such that the upper surfaces thereof are located below the upper ends of the TiN layers 15a to 15d to form a SiO$_2$ layer 20a (an example of the "first insulating layer" in the claims) and SiO$_2$ layers 24aa and 24bb. Subsequently, a W layer (not illustrated) connected to the TiN layers 15a to 15d is formed at outer peripheral portions of the TiN layers 15a to 15d. Subsequently, mask material layers 27a and 27b partially overlapping the TiN layers 15a and 15b and the TiN layers 15c and 15d, respectively, and extending in a band shape in the line X-X' direction in plan view are formed. Subsequently, the W layer is etched using the mask material layers 27a and 27b as masks. Thus, W layers 26a and 26b (examples of the "second conductor layer" in the claims) connected to the TiN layers 15a and 15b and the TiN layers 15c and 15d, respectively, and extending in the line X-X' direction (an example of the "second direction" in the claims) in plan view are formed. In plan view, widths L1 of the W layers 26a and 26b in the line Y-Y' direction are smaller than widths L2 of the outer peripheries of the gate TiN layers 15a to 15d in the line Y-Y' direction. L2 is a longest line segment among point-to-point distances between intersections of the outer peripheral lines of the gate TiN layers 15a to 15d and straight lines extending in the line Y-Y' direction.

Figure 1K:
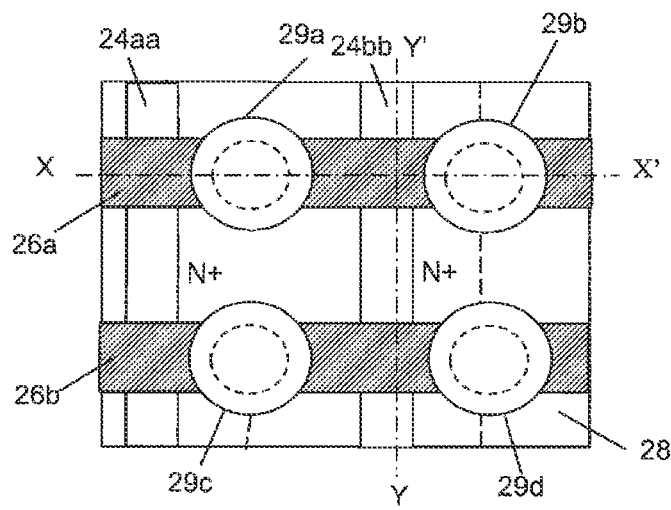
FIGS. 1KA, 1KB, and 1KC are respectively a plan view, a sectional structural view, and another sectional structural view that illustrate the method for manufacturing an SGT-including memory semiconductor device according to the first embodiment.
Figure 1K:
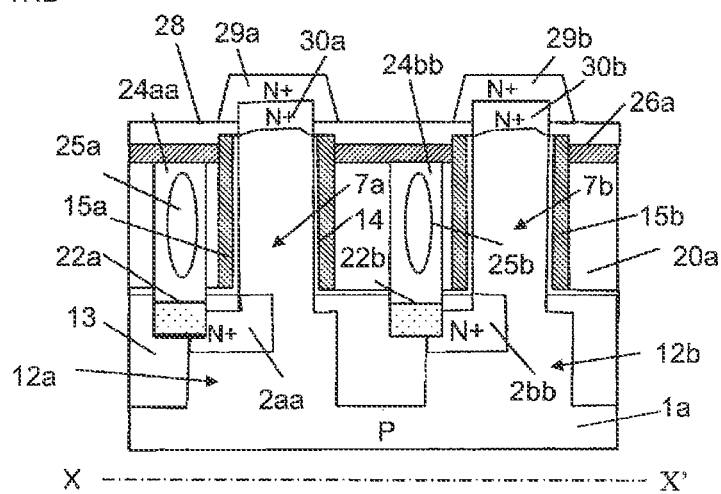
Figure 1K:
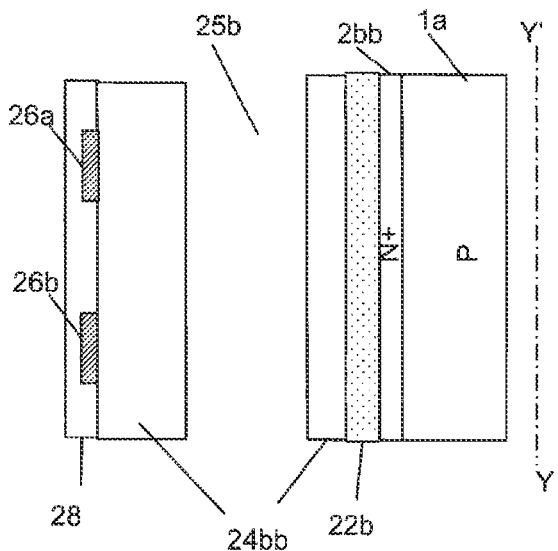

Next, as illustrated in FIGS. 1KA to 1KC, a SiO$_2$ layer 28 is formed at outer peripheral portions around the side surfaces of the top portions of the Si pillars 7a to 7d. Subsequently, N$^+$ layers 29a, 29b, 29c, and 29d are formed by, for example, selective epitaxial growth so as to cover the top portions of the Si pillars 7a, 7b, 7c, and 7d, respectively. Subsequently, N$^+$ layers 30a, 30b, 30c (not illustrated), and 30d (not illustrated) are formed in the top portions of the Si pillars 7a, 7b, 7c, and 7d, respectively, by thermal diffusion. Thus, selection SGTs in a DRAM are formed. In this case, the W layers 22a and 22b serve as bit line electrodes, and the W layers 26a and 26b serve as word line electrodes. Subsequently, a capacitor is connected to the $N^+$ layers 29a to 29d. Thus, a DRAM device is formed on the P layer substrate 1a.

While this embodiment has been described in the context of forming the $N^+$ layers 2aa and 2bb at parts of inner sides of the Si pillars 7a to 7d in plan view, the $N^+$ layers 2aa and 2bb may be formed at the entire inner sides. In the case of, for example, an RRAM, an MRAM, or a PCM, a variable resistive element whose resistance varies according to the voltage applied is connected to each $N^+$ layer instead of the capacitor in a DRAM. In the case of these elements, the $N^+$ layers 2aa and 2bb may be formed at the entire inner sides of the Si pillars 7a to 7d in plan view. Also in the case of a capacitorless DRAM (see, for example, M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)), the $N^+$ layers 2aa and 2bb may be formed at the entire inner sides of the Si pillars 7a to 7d in plan view. In the case of a capacitorless DRAM, impurity regions on upper and lower sides of SGTs, one of the impurity regions serving as a source, the other serving as a drain, may have different polarities (see, for example, J. Wan, L. Rojer, A. Zaslavsky, and S. Critoloveanu: "A Compact Capacitor-Less High-Speed DRAM Using Field Effect-Controlled Charge Regeneration", Electron Device letters, Vol. 35, No. 2, pp. 179-181 (2012)). While the W layers 22a and 22b are bit line electrodes in the DRAM according to this embodiment, the W layers 22a and 22b may be used as other electrodes such as source line electrodes or ground line electrodes in the case of, for example, an RRAM, an MRAM, or a PCM.

The $N^+$ layers 30a to 30d formed in the top portions of the Si pillars 7a to 7d, respectively, may be, for example, $N^+$ layers that are formed on the P layer 4 by epitaxial crystal growth after the formation of the P layer 4 and before the formation of the mask material layers 5a to 5d in FIGS. 1BA to 1BC. In this case, the step, as illustrated in FIGS. 1KA to 1KC, of forming the $N^+$ layers 30a to 30d by performing heat treatment to cause diffusion of a donor impurity from the $N^+$ layers 29a to 29d into the top portions of the Si pillars 7a to 7d, respectively, is not necessary. When the $SiO_2$ layer 28 is thick, if a high-temperature, long heat treatment is performed so that the lower ends of the $N^+$ layers 30a to 30d become flush with the upper ends of the gate TiN layers 15a to 15d, respectively, in the vertical direction, the gate TiN layers 15a to 15d and the $HfO_2$ layer 14 serving as a gate insulating layer may be damaged. To overcome this problem, by forming an $N^+$ layer on the P layer 4 after the formation of the P layer 4 in FIGS. 1BA to 1BC and forming the $N^+$ layers 30a to 30d from this impurity layer, thermal damage to the gate TiN layers 15a to 15d and the $HfO_2$ layer 14 serving as a gate insulating layer as described above can be avoided. This also eliminates the need for forming the $N^+$ layers 30a to 30d in the top portions of the Si pillars 7a to 7d, respectively, by thermal diffusion at the stage of FIGS. 1KA to 1KC, thus facilitating the formation of impurity regions in the top portions of the Si pillars 7a to 7d. In this case, the $N^+$ layers 29a to 29d may be, but need not be, formed. In this case, the $N^+$ layers 29a to 29d may be replaced with conductor layers made of, for example, a metal or an alloy.

In FIGS. 1FA to 1FC, the thickness of the TiN layer 15 serving as a gate conductor layer is larger than those of the SiN layers 17a, 17b, 17c, and 17d. However, the thickness of the TiN layer 15 may be smaller than those of the SiN layers 17a, 17b, 17c, and 17d, and a conductor layer such as a TaN layer or an insulating layer such as a SiN layer may be provided as a protective layer for the TiN layer 15 outside the TiN layer 15. In this case, in the process of forming the gate TiN layers 15a to 15d in FIGS. 1GA to 1GC, this protective layer is left so as to surround the side surfaces of the gate TiN layers 15a to 15d. When an insulating layer is formed as the protective layer, the protective layer around the side surfaces of the top portions of the gate TiN layers 15a to 15d is removed before the formation of the W layers 26a and 26b in FIGS. 1IA to 1IC.

When the above-described protective layer surrounding the side surfaces of the gate TiN layers 15a to 15d is an insulating layer such as a SiN layer, it is preferable to use, for example, a SiN layer, which is etched slower than the $SiO_2$ layer 20 in the formation of the contact holes 21a and 21b by RIE etching. Instead of the SiN layer, a material layer that serves as an etching stopper may be used. After the formation of the contact holes 21a and 21b, the following procedure may be employed: the inside of the contact holes 21a is coated with, for example, a thin insulating layer such as a SiN layer serving as an etching stopper, and the SiN layer at the bottom portions of the contact holes 21a and 21b is then removed by RIE, after which the W layers 22a and 22b are formed. In this case, to reduce the contact resistance between the W layer 22a and the $N^+$ layer 2aa and between the W layer 22b and the $N^+$ layer 2bb, the sectional shape of the bottom portions of the contact holes 21a and 21b is desirably formed such that the lowermost part area is smaller than the upper part area in plan view.

In FIGS. 1AA to 1AC, a $P^+$ layer may be formed outside the $N^+$ layers 2a and 2b in such a manner that a boron (B) impurity is contained in the $N^+$ layers 2a and 2b in an amount smaller than the amount of a phosphorus (P) impurity, and the B impurity is then diffused into the P layer substrate 1 by heat treatment. This can reduce the expansion of a junction depletion layer between the $N^+$ layers 2aa and 2bb and the P layer substrate 1a in FIGS. 1JA to 1JC and allows unwanted carriers that have been thermally generated in channels of the Si pillars 7a to 7d to be easily discharged to the P layer substrate 1a side. The $P^+$ layer may be formed by epitaxial crystal growth before the $N^+$ layers 2a and 2b are formed by epitaxial crystal growth. The $P^+$ layer may be formed by any other method as long as the $P^+$ layer is suitable for the object of the present invention. In the case of a capacitorless DRAM, at the outside of either the upper or lower impurity region, an impurity region having a polarity opposite to the polarity of the upper or lower impurity region may be formed by the same method.

This embodiment provides the following features.

1. In this embodiment, as illustrated in FIGS. 1HA to 1HC and 1IA to 1IC, after TiN layers 15a to 15d serving as gate electrodes are formed, contact holes 21a and 21b are formed, and bit line W layers 22a and 22b respectively connecting to the $N^+$ layers 2aa and 2bb are then formed at bottom portions of the contact holes 21a and 21b, respectively. Subsequently, $SiO_2$ layers 24a and 24b effectively serving as low-dielectric-constant layers and respectively having holes 25a and 25b are formed in the contact holes 21a and 21b on the W layers 22a and 22b, respectively. Thereafter, as illustrated in FIGS. 1JA to 1JC, word line W layers 26a and 26b connected to the gate electrode TiN layers 15a and 15b and the gate electrode TiN layers 15c and 15d, respectively, are formed on the $SiO_2$ layers 20a, 24aa, and 24bb so as to be orthogonal to the bit line W layers 22a and 22b in plan view.

The above process offers the following features.
(1) Since the $SiO_2$ layers 24aa and 24bb respectively having the holes 25a and 25b and effectively serving as low-dielectric-constant layers and the bit line W layers 22a and 22b are formed in the contact holes 21a and 21b, respectively, the bit line W layers 22a and 22b and the $SiO_2$ layers 24aa and 24bb serving as low-dielectric-constant layers are formed in a self-aligned manner. This can provide a DRAM memory cell with higher integration. As illustrated in FIG. 1JA, the $SiO_2$ layers 24aa and 24bb effectively serving as low-dielectric-constant layers are present in regions where the bit line W layers 22a and 22b and the word line W layers 26a and 26b overlap each other in plan view. This can reduce the capacitance between the bit lines and the word lines. A DRAM memory cell with higher integration and higher performance, which is due to the reduction in the capacitance between the bit lines and the word lines, can be provided.
(2) The word line W layers 26a and 26b are connected only to upper portions of the gate electrodes 15a and 15b and the gate electrodes 15c and 15d, respectively, in the height direction. In this configuration, the height of a portion between the word line W layers 26a and 26b facing each other is small compared to, for example, a configuration in which the word line W layers 26a and 26b are formed so as to have the same height as those of the gate electrodes 15a to 15d, and thus the capacitance between the word lines can be significantly reduced.
(3) Due to the configuration in which the $SiO_2$ layers 24aa and 24bb serving as low-dielectric-constant layers and respectively having the holes 25a and 25b are formed between the word line W layers 26a and 26b, the capacitance between the word line W layers 26a and 26b is reduced.

2. In this embodiment, as illustrated in FIG. 1ED, the P layer bases 12a and 12b are shaped such that portions surrounding the Si pillars 7a to 7b protrude on the side opposite the $N^+$ layers 2aa and 2bb in plan view. These protruding portions are formed in a self-aligned manner with the Si pillars 7a to 7d. This self-alignment enables the protruding P layer bases 12a and 12b to be formed as small areas with high accuracy. In plan view, the P layer bases 12a and 12b on the side where the bit line W layers 22a and 22b are formed are formed of the mask material layers 11a and 11b, respectively.

The above process offers the following features.
(1) As can be seen from FIGS. 1KA to 1KC, the capacitance between the bit line W layers 22a and 22b is constituted by a junction capacitance of the $N^+$ layers 2aa and 2bb and a capacitance of the P layer bases 12a and 12b of Si and the $SiO_2$ layer 13 between the bit line W layers 22a and 22b. The relative dielectric constant of Si is 12, which is larger than 3.9 of $SiO_2$. Therefore, to reduce the capacitance between the bit line W layers 22a and 22b, the length of the P layer bases 12a and 12b between the bit line W layers 22a and 22b needs to be small. As can be seen from FIG. 1ED, areas of the P layer bases 12a and 12b that are closest to the bit line W layers 22a and 22b are protruding portions surrounding the Si pillars 7a to 7d. The P layer bases 12a and 12b at these protruding portions are formed in a self-aligned manner with respect to the Si pillars 7a and 7c and the Si pillars 7b and 7d, respectively. This can reduce the width of the P layer bases 12a and 12b respectively surrounding the Si pillars 7a and 7c and the Si pillars 7b and 7d. This can increase the distance between the P layer base 12a and the bit line W layer 22a and between the P layer base 12b and the bit line W layer 22b, thus reducing the capacitance between the bit lines.
(2) As can be seen from FIGS. 1EA to 1ED, regions of the P layer bases 12a and 12b on the side where the bit line W layers 22a and 22b are to be formed are defined by the mask material layers 11a and 11b, respectively. The mask material layers 11a and 11b are only required to overlap the SiN layers 10a and 10c and the SiN layers 10b and 10d, respectively, in plan view. As long as this requirement is satisfied, the width of the mask material layers 11a and 11b in the line X-X' direction can be as small as possible within the manufacturable range. This can reduce the Si capacitance of the P layer bases 12a and 12b.

3. In this embodiment, as illustrated in FIGS. 1KA to 1KC, the TiN layers 15a to 15d serving as gate electrodes are formed in a self-aligned manner with respect to the Si pillars 7a to 7d, respectively. The word line W layers 26a and 26b are formed in a band shape in the line X-X' direction so as to be connected to portions of the outer peripheries of the gate electrode TiN layers 15a and 15b and the gate electrode TiN layers 15c and 15d, respectively. In plan view, the widths of the W layers 26a and 26b in the line Y-Y' direction are smaller than the widths of the outer peripheries of the TiN layers 15a to 15d in the line Y-Y' direction.

The above process offers the following features.
(1) The word line W layers 26a and 26b are formed using the mask material layers 27a and 27b, respectively, as etching masks separately from the formation of the gate line TiN layers 15a to 15d. This enables the widths of the word line W layers 26a and 26b in the line Y-Y' direction to be as small as possible while satisfying the condition that the word line W layers 26a and 26b connect to the gate line TiN layers 15a and 15b and the gate line TiN layers 15c and 15d, respectively. This can increase the distance between the word line W layers 26a and 26b in the line Y-Y' direction. This can reduce the capacitance between the word line W layers 26a and 26b.
(2) The gate TiN layers 15a to 15d are formed in a self-aligned manner with respect to the Si pillars 7a to 7d, respectively. This enables the distance between the gate electrodes 15a and 15c and the distance between the gate electrodes 15b and 15d to be wide in plan view. This can also reduce the capacitance between the word line W layers 26a and 26b.

Second Embodiment

Figure 2A:
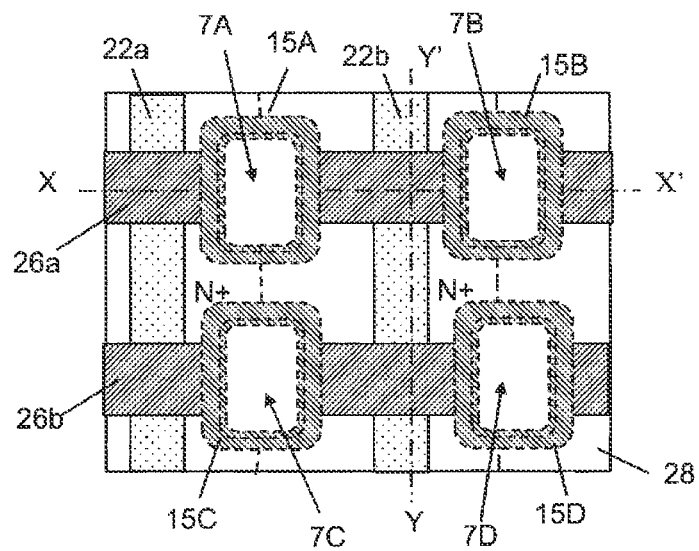
FIGS. 2A, 2B, and 2C are respectively a plan view, a sectional structural view, and another sectional structural view that illustrate a method for manufacturing an SGT-including memory semiconductor device according to a second embodiment.

Hereinafter, a method for manufacturing a DRAM circuit according to a second embodiment of the present invention will be described with reference to FIGS. 2A to 2C. FIG. 2A is a plan view, and FIGS. 2B and 2C are sectional structural views taken along line X-X' and line Y-Y', respectively, in FIG. 2A.

Figure 2B:
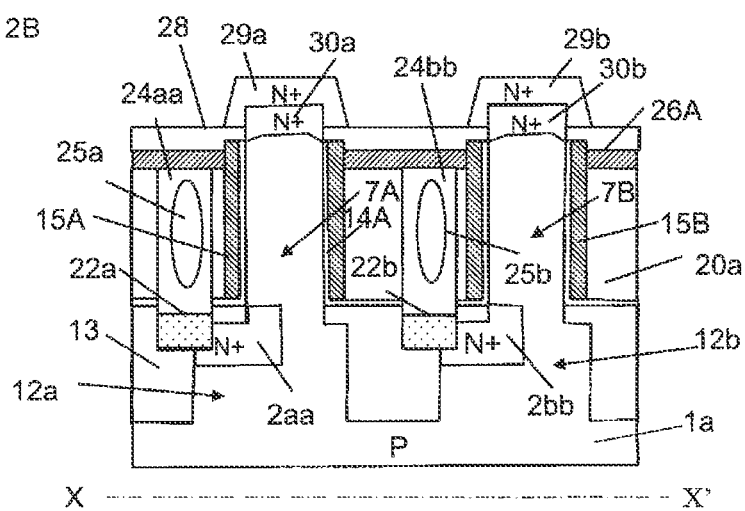
Figure 2C:
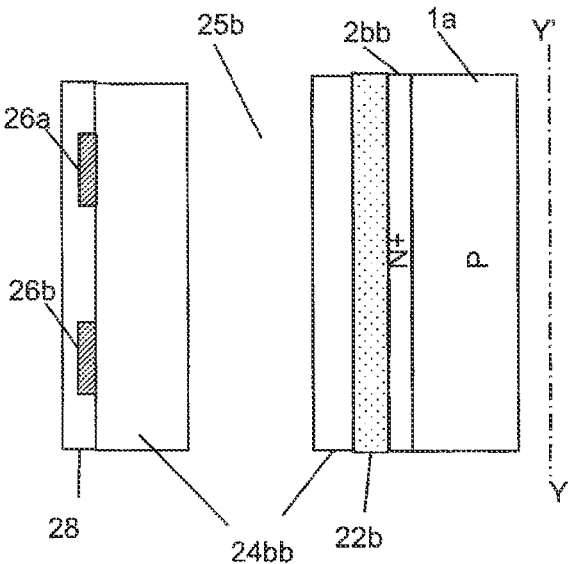
Figure 3:
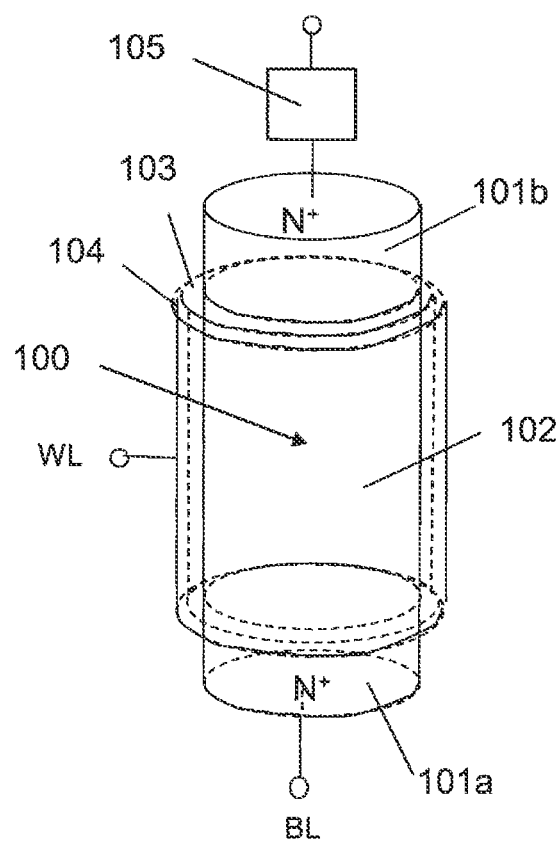
FIG. 3 is a three-dimensional structural view that illustrates a conventional example.

As illustrated in FIGS. 2A to 2C, Si pillars 7A, 7B, 7C, and 7D rectangular in plan view are formed such that the long sides thereof are parallel to the bit line W layers 22a and 22b. Subsequently, a gate insulating layer 14A is formed so as to surround the Si pillars 7A to 7D. Subsequently, gate TiN layers 15A, 15B, 15C, and 15D are formed so as to surround the gate insulating layer 14A on the side surfaces of the Si pillars 7A, 7B, 7C, and 7D, respectively. Other processes are the same as those in the first embodiment.

This embodiment provides the following features.

In the first embodiment, the sections of the Si pillars 7a to 7d in plan view are circular. By contrast, the shape of the sections of the Si pillars 7A to 7D in this embodiment is a rectangle extending in the line Y-Y' direction. This can achieve channel sectional areas larger than those of the SGTs formed at the Si pillars 7a to 7d in the first embodiment, thus reducing the effective SGT series resistance. In addition, due to the configuration in which the long sides of the rectangular Si pillars 7A to 7D are parallel to the bit line W layers 22a and 22b, the resistance between the bit line W layer 22a and the N+ layer 2aa and between the bit line W layer 22b and the N+ layers probably can be reduced.

Other Embodiments

While the Si pillars 7a to 7d are formed in the first embodiment, semiconductor pillars made of other semiconductor materials may also be used. The same applies to other embodiments according to the present invention.

The N+ layers 2aa, 2bb, 29a, and 29b in the first embodiment may each be formed of Si containing a donor impurity or any other semiconductor material. The N+ layers 2aa, 2bb, 29a, and 29b may be formed of different semiconductor materials. The same applies to other embodiments according to the present invention.

The N+ layers 29a to 29d and 30a to 30d formed on and in the top portions of the Si pillars 7a to 7d, respectively, in the first embodiment may each be, for example, an N+ layer that is formed on the P layer 4 by epitaxial crystal growth after the formation of the P layer 4 in FIGS. 1BA to 1BC. The N+ layer may be formed by any other method. The same applies to other embodiments according to the present invention.

The mask material layers 5a to 5d, 11a, and 11b in the first embodiment may be replaced with another material layer having a single-layer structure or a multilayer structure and containing an organic material or an inorganic material as long as the material is suitable for the object of the present invention. The SiO2 layers 9a and 9b and the SiN layers 10a to 10d used as etching masks may also be replaced with another material layer having a single-layer structure or a multilayer structure and containing an organic material or an inorganic material as long as the material is suitable for the object of the present invention. The same applies to other embodiments according to the present invention.

The W layers 22a and 22b in the first embodiment may be made of not only a metal but also an alloy or a conductive material such as a semiconductor containing an acceptor or donor impurity in a large amount, and may have a single-layer structure or a multilayer structure. The same applies to other embodiments according to the present invention.

In the first embodiment, the TiN layers 15a to 15d are used as gate conductor layers. The TiN layers 15a to 15d may each be any material layer having a single-layer structure or a multilayer structure as long as the material is suitable for the object of the present invention. The TiN layers 15a to 15d may each be formed of a conductor layer having at least a desired work function, such as a metal layer having a single-layer structure or a multilayer structure. Another conductive layer such as a W layer may be formed outside the TiN layers. Instead of the W layer, a metal layer having a single-layer structure or a multilayer structure may be used.

The word line W layers 26a and 26b connecting to the TiN layers 15a and 15b and the TiN layers 15c and 15d, respectively, in the first embodiment may be formed of a laminate with another conductor layer or formed of another conductor layer. The same applies to other embodiments according to the present invention.

Furthermore, while the HfO2 layer 14 is used as a gate insulating layer, other material layers each having a single-layer structure or a multilayer structure may be used. The same applies to other embodiments according to the present invention.

In FIGS. 1HA to 1HC and FIGS. 1IA to 1IC of the first embodiment, the SiO2 layers 24a and 24b respectively having the holes 25a and 25b are formed. However, upper portions of the contact holes 21a and 21b may be covered with a SiN layer by, for example, chemical vapor deposition (CVD) to form the holes 25a and 25b. Alternatively, an insulating layer formed of an inorganic or organic layer having the holes 25a and 25b may be formed by another method.

In the first embodiment, the shapes of the Si pillars 7a to 7d in plan view are circular. In the second embodiment, the shapes of the Si pillars 7A to 7D in plan view are rectangular. The shapes of these Si pillars in plan view may not only be circular or rectangular but also be elliptical or U-shaped. These shapes may coexist on the same P layer substrate 1a. The same applies to other embodiments according to the present invention.

While the first embodiment has been described in the context where one memory cell is constituted by one selection SGT, a plurality of SGTs may be connected in parallel in order to achieve a high drive current or low effective SGT series resistance. The same applies to other embodiments according to the present invention.

This embodiment has been described in the context of XY addressing memory devices such as a DRAM, a capacitor-less DRAM, an RRAM, an MRAM, and a PCM. The present invention is also applicable to other XY addressing memory devices. For higher performance, a plurality of SGTs may be used for one memory cell. A plurality of variable resistive elements for RRAM, MRAM, or PCM may be connected to one SGT.

While the SGTs are formed on the P layer substrate 1 in the first embodiment, the P layer substrate 1 may be replaced with a silicon-on-insulator (SOI) substrate. Alternatively, any other material substrate may be used as long as it serves as a substrate. The same applies to other embodiments according to the present invention.

While the first embodiment has been described in the context of SGTs in which sources and drains are formed on the upper and lower sides of the Si pillars 7a to 7d using the N+ layers 2aa, 2bb, 29a to 29d, and 30a to 30d having conductivity of the same polarity, the present invention is also applicable to tunneling SGTs including sources and drains having different polarities. The same applies to other embodiments according to the present invention.

While one SGT is formed at one semiconductor pillar in the embodiments according to the present invention, the present invention is also applicable to the formation of circuits in which two or more SGTs are formed at one semiconductor pillar.

Various embodiments and modifications of the present invention can be made without departing from the broad spirit and scope of the present invention. The foregoing embodiments are illustrative of examples of the present invention and are not intended to limit the scope of the present invention. The foregoing examples and modifications can be combined in any manner. Furthermore, the foregoing embodiments fall within the scope of the technical idea of the present invention even if some elements are excluded from those embodiments as needed.

The method for manufacturing an SGT-including memory device according to the present invention provides an SGT-including memory device with high density and high performance.

What is claimed is:

1. A method for manufacturing a memory device including a pillar-shaped semiconductor element that includes
    a semiconductor pillar standing perpendicularly on a substrate and including a first impurity region disposed at a bottom portion, a second impurity region disposed at a top portion, and a region between the first impurity region and the second impurity region serving as a channel, one of the first impurity region and the second impurity region serving as a source, the other serving as a drain,
    a gate insulating layer surrounding the semiconductor pillar disposed between the first impurity region and the second impurity region, and
    a gate conductor layer surrounding the gate insulating layer, the method comprising:
    a step of forming the first impurity region such that the first impurity region extends in a band shape in a first direction in plan view;
    a step of forming the semiconductor pillar that at least partially overlaps the first impurity region in plan view,
    a step of forming a semiconductor base that includes the semiconductor pillar and the first impurity region and extends in a band shape in the first direction in plan view such that the semiconductor base connects to the bottom portion of the semiconductor pillar;
    a step of forming the gate insulating layer and the gate conductor layer such that the semiconductor pillar is surrounded;
    a step of forming a first insulating layer at an outer peripheral portion of the gate conductor layer;
    a step of forming, in the first insulating layer, a contact hole that overlaps the first impurity region disposed in the semiconductor base in plan view, has a bottom portion in contact with the first impurity region, and extends in a band shape in the first direction;
    a step of forming, at the bottom portion of the contact hole, a first conductor layer that is in contact with the first impurity region and extends in a band shape in the first direction;
    a step of forming, in the contact hole on the first conductor layer, a second insulating layer that has a hole or has a lower dielectric constant than the first insulating layer;
    a step of lowering an upper surface of the second insulating layer below an upper end of the gate conductor layer; and
    a step of forming a second conductor layer that is in contact with the gate conductor layer and extends in a band shape in a second direction perpendicular to the first direction in plan view.

2. The method for manufacturing a memory device including a pillar-shaped semiconductor element according to claim 1, further comprising:
    a step of forming the semiconductor pillar using a first mask material layer as an etching mask;
    a step of forming a third insulating layer that surrounds the semiconductor pillar and has an upper surface located at a bottom portion of the first mask material layer or the top portion of the semiconductor pillar;
    a step of forming a second mask material layer that is disposed on the third insulating layer and surrounds the exposed first mask material layer and the top portion of the semiconductor pillar with an equal width in plan view;
    a step of forming, on the third insulating layer, a third mask material layer that partially overlaps the second mask material layer and extends in a band shape in the first direction in plan view; and
    a step of forming the semiconductor base by etching the third insulating layer, the first impurity region, and the substrate using the first mask material layer, the second mask material layer, and the third mask material layer as masks,
    wherein, in plan view, the second mask material layer partially protrudes beyond the third mask material layer on an opposite side of the semiconductor pillar from the first conductor layer in the second direction.

3. The method for manufacturing a memory device including a pillar-shaped semiconductor element according to claim 1,
    wherein, in the first direction in plan view, the second conductor layer is formed so as to have a width that is smaller than a longest line segment among point-to-point distances between intersections of an outer peripheral line of the gate conductor layer and straight lines extending in the first direction.

4. The method for manufacturing a memory device including a pillar-shaped semiconductor element according to claim 1,
    wherein, in a vertical direction, the first conductor layer is formed so as to have an upper end that is located below a lower end of the gate conductor layer.

5. The method for manufacturing a memory device including a pillar-shaped semiconductor element according to claim 1,
    wherein, in a vertical direction, the hole is formed so as to have an upper end that is located below an upper end of the gate conductor layer.

6. The method for manufacturing a memory device including a pillar-shaped semiconductor element according to claim 1, comprising:
    a step of forming, in the semiconductor base outside the first impurity region or the semiconductor pillar outside the second impurity region, a third impurity region that has a polarity opposite to that of the first impurity region or the second impurity region.

7. The method for manufacturing a memory device including a pillar-shaped semiconductor element according to claim 1,
    wherein the semiconductor pillar is formed such that a length in the first direction is larger than a length in the second direction in plan view.

8. The method for manufacturing a memory device including a pillar-shaped semiconductor element according to claim 1, further comprising:
    a step of forming, on the substrate, a first impurity layer on which the first impurity region is based;
    a step of forming, on the first impurity layer, a first semiconductor layer on which the semiconductor pillar is partially based; and
    a step of forming, on the first semiconductor layer, a second impurity layer on which the semiconductor pillar is partially based and which forms at least a part of the second impurity region.

9. The method for manufacturing a memory device including a pillar-shaped semiconductor element according to claim 8, further comprising:
- a step of forming, after forming the gate conductor layer, a fourth insulating layer that has an upper surface located above the gate conductor layer and below an upper surface of the second impurity layer and surrounds an outer periphery of the second impurity layer; and
- a step of forming a third impurity layer that is in contact with the second impurity layer and has the same polarity as that of the second impurity layer or a conductor layer that is in contact with the second impurity layer and made of an alloy or a metal.

10. A memory device including a pillar-shaped semiconductor element, comprising:
- a semiconductor pillar standing in a direction perpendicular to a substrate;
- a first impurity region connecting to a bottom portion of the semiconductor pillar and extending in a band shape in a first direction so as to at least partially overlap the semiconductor pillar in plan view;
- a second impurity region disposed at a top portion of the semiconductor pillar;
- a gate insulating layer surrounding the semiconductor pillar between the first impurity region and the second impurity region;
- a gate conductor layer surrounding the gate insulating layer;
- a semiconductor base connecting to the bottom portion of the semiconductor pillar, including the first impurity region, and extending in a band shape in the first direction in plan view;
- a first insulating layer disposed at an outer peripheral portion of the gate conductor layer;
- a first conductor layer having a bottom portion in contact with the first impurity region and extending in a band shape in the first direction;
- a second insulating layer disposed on the first conductor layer, and having a hole whose upper surface is located below an upper end of the gate conductor layer or having a dielectric constant lower than that of the first insulating layer; and
- a second conductor layer disposed on the second insulating layer, being in contact with the gate conductor layer, and extending in a band shape in a second direction perpendicular to the first direction in plan view.

11. The memory device including a pillar-shaped semiconductor element according to claim 10,
wherein, in plan view, the semiconductor base surrounding the semiconductor pillar partially protrudes on an opposite side of the semiconductor pillar from the first conductor layer in the second direction.

12. The memory device including a pillar-shaped semiconductor element according to claim 10,
wherein, in plan view, a width of the second conductor layer in the first direction is smaller than a longest line segment among point-to-point distances between intersections of an outer peripheral line of the gate conductor layer and straight lines extending in the first direction.

13. The memory device including a pillar-shaped semiconductor element according to claim 10,
wherein, in a vertical direction, an upper end of the first conductor layer is located below a lower end of the gate conductor layer.

14. The memory device including a pillar-shaped semiconductor element according to claim 10, further comprising, outside the first impurity region, a third impurity region having a polarity opposite to that of the first impurity region.

15. The memory device including a pillar-shaped semiconductor element according to claim 10,
wherein the semiconductor pillar is formed so as to have a section extending in the first direction in plan view.

* * * * *